July 25, 1967 R. E. CHRISTIAN 3,333,122

ELECTRICAL DEVICE

Filed Jan. 9, 1964

INVENTOR.
ROBERT E. CHRISTIAN

BY Mueller & Aichele

Attys.

United States Patent Office 3,333,122
Patented July 25, 1967

3,333,122

ELECTRICAL DEVICE

Robert E. Christian, Downers Grove, Ill., assignor to Motorola, Inc., Franklin Park, Ill., a corporation of Illinois Filed Jan. 9, 1964, Ser. No. 336,675
2 Claims. (Cl. 310—9.1)

This invention relates to a crystal mount and in particular to an improved mounting structure for low frequency crystals.

Quartz crystals used in electronic circuits are positioned within a mounting structure which provides both an electrical connection to and mechanical support for the crystal plate. The mount used is a factor in determining the maximum size of the crystal plate which can be put into an enclosure of specified internal dimensions and in determining the mechanical reliability and frequency stability of the crystal. Prior art mounting structures require a large holder for a given crystal plate size and the crystals are subject to breakage and frequency instability in the presence of mechanical stress. The shortcomings of these mounting structures are particularly evident with low frequency crystal plates.

Accordingly, it is an object of this invention to provide an improved mounting structure for a crystal plate which is of simple and inexpensive construction.

A further object of the invention is to provide a crystal mounting structure which minimizes breakage and frequency instability of the crystal plate as a result of mechanical stress within the mounting structure.

Another object of this invention is to provide an improved mounting structure for a crystal plate which will reduce the size of housing required for a given crystal, or increase the size of a crystal plate which can be placed in an enclosure of specified internal dimensions.

A feature of this invention is the provision of an improved crystal plate mounting structure with a pair of mounting members, each having crystal holding means formed thereon to grasp the crystal at more than one point along its edges.

Another feature of this invention is the provision of a crystal plate mounting structure in which a pair of wire mounting members are placed in a crossed relationship with each other, with the crystal plate positioned between said mounting members.

In practicing this invention a crystal mounting structure is provided having a base with terminals extending therethrough. A pair of wire mounting members are connected to the terminals. The mounting members are made of wire having concave U-shaped bends formed therein for holding the thin cylindrical crystal plate at its edge. Each wire mounting member has two such bends engaging opposite edges of the crystal plate. The mounting members are placed in a crossed relationship with each other forming an X shape with the crystal plate positioned between the wire mounting members and held by the bends formed thereon. The crystal plate has electrodes plated on each of the major opposite surfaces. The electrodes have tabs extending to the edge in such a manner that the plating on each surface can be electrically connected to a different one of said mounting members. The bends formed on the mounting members are mechanically connected to the crystal plate by a conductive cement. At least one of the bends on each mounting member is electrically coupled to an electrode by the conductive cement.

The invention is illustrated in the drawings wherein.

Figure 1:
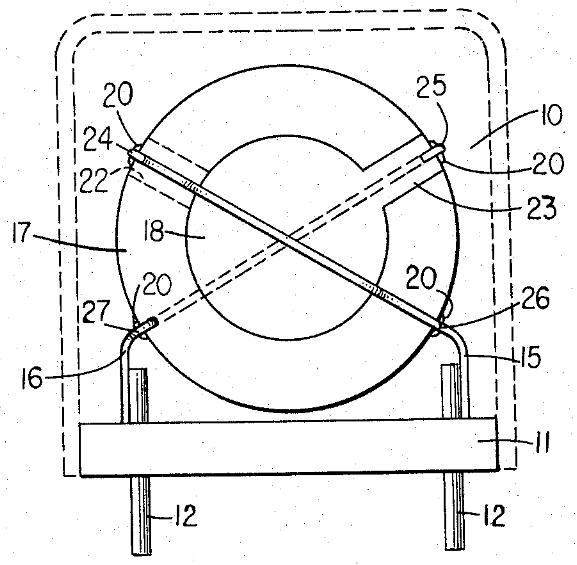
FIG. 1 is a view of the mounting structure.
Figure 2:
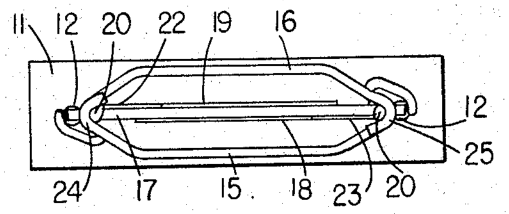
FIG. 2 is a top view of the structure shown in FIG. 1.

A structure embodying the features of this invention is illustrated in FIGS. 1 and 2. Identical parts in the two figures have the same identifying numerals. An enclosed crystal holder is provided having a base structure 11 through which two terminals 12 are mounted. One end of mounting members 15 and 16, formed from wire, are secured to terminals 12. A crystal plate 17 in the shape of a thin cylinder has electrodes 18 and 19 plated on its major opposite surfaces. Electrodes 18 and 19 are circular in shape and are concentrically positioned with respect to the edges of crystal plate 17. Electrodes 18 and 19 have tab portions 23 and 22 extending to the edge of crystal plate 17.

Each of the wire mounting members 15 and 16 have concave U-shaped bends 24 and 25 formed in one end and concave U-shaped bends 26 and 27 located intermediate the ends of mounting members 15 and 16 to hold crystal plate 17 by its edge. Bend 25 of mounting member 16 is in contact with tab 23 of electrode 18 and bend 24 of mounting member 15 is in contact with tab 22 of electrode 19. A conductive cement 20 secures the crystal plate to each of the mounting members 15 and 16 at bends 24, 25, 26 and 27. Since the cement is conductive it also provides an electrical connection between the mounting members 15 and 16 and the electrodes 18 and 19 with which they are individually in contact. Crystal plate 17 is positioned between the two mounting members 15 and 16. Mounting members 15 and 16 have a crossed relationship with each other forming an X structure. In operation a potential applied to terminals 12 from an external source is coupled to crystal plate 17 through terminals 12, mounting members 15 and 16 and electrodes 18 and 19.

Figure 3:
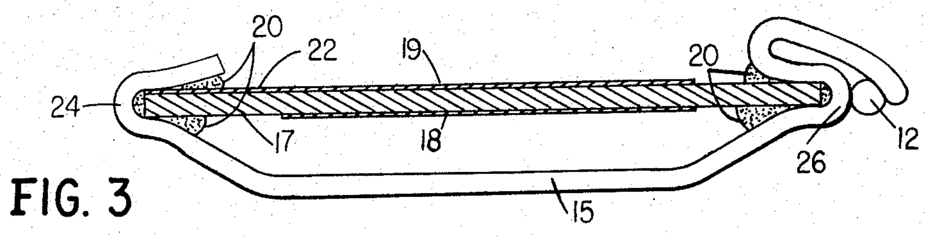
FIG. 3 is an enlarged view of the wire mounting member.

An enlarged view of mounting member 15 and crystal plate 17 is shown in FIG. 3. Mounting member 15 is identical with mounting members 15 and 16 of FIGS. 1 and 2. Mounting member 15 is formed from a wire and has bends 24 and 26 formed thereon to grasp and hold crystal plate 17 at its edge. Tab 22 of the plated electrode 19 is shown extending to the edge of crystal plate 17 where it is in contact with bend 24 of wire supporting member 15. Bend 24 is mechanically and electrically fastened to crystal plate 17 and tab 22 of electrode 19 by a conductive cement 20. Bend 26 of mounting member 15 is also fastened to crystal plate 17 by a conductive cement 20.

The structure described is mechanically simple to build and to assemble. It permits the use of a large crystal blank in a holder having minimum internal dimensions. Supporting the crystal plate at four points restricts its movement when the crystal mount is subjected to mechanical stresses and thereby the crystal plate is protected from breakage and frequency instability.

I claim:

1. In a structure for mounting a crystal plate used as a frequency reference for electronic devices and having an edge and two opposite major surfaces with an electrode on each of the opposite surfaces, the combination including, a pair of mounting members each adapted to hold the crystal at two different points along its edge, each of said mounting members being mechanically connected to the crystal and electrically connected to a different one of the electrodes, a mounting base having a pair of terminals extending theerthrough, said terminals being mechanically and electrically connected to separate ones of said mounting members for holding the same in fixed relationship with said base, said mounting members being positioned in a crossed relationship forming an X structure to support the crystal plate.

2. In a structure for mounting a thin cylindrical crystal plate used as a frequency reference for electronic devices and having a conductive electrode on each of the major opposite surfaces thereof, the combination including, a pair of conductive wire mounting members each having first and second ends, said mounting members having a first concave bend formed at said first end and a second concave bend formed between said first and second ends, said first and second bends being shaped to grasp the crystal plate at opposite edges thereof, a mounting base having a pair of terminals extending therethrough, said second ends of said mounting members being individually mechanically and electrically connected to separate ones of said pair of terminals whereby said mounting members are held in fixed relationship with said base, said mounting members being positioned in a crossed relationship forming an X structure with the crystal plate positioned therebetween, said first and second bends being mechanically coupled to the edge of the crystal plate to support the same with each of said mounting members being electrically coupled to a different one of the electrodes, and a conductive bonding material mechanically and electrically bonding each of said crystal holding means to the crystal plate.

References Cited

UNITED STATES PATENTS

| | | | |
|---|---|---|---|
| 2,282,319 | 5/1942 | Brown | 310—9.1 |
| 2,392,429 | 1/1946 | Sykes | 310—9.7 |
| 2,641,718 | 6/1953 | Samuelson | 310—9.4 |
| 2,857,532 | 10/1958 | Ziegler | 310—9.7 |
| 3,176,168 | 3/1965 | Barrett | 310—9.7 |

MILTON O. HIRSHFIELD, *Primary Examiner.*

J. D. MILLER, *Assistant Examiner.*